(12) United States Patent
Kuramochi et al.

(10) Patent No.: US 8,223,814 B2
(45) Date of Patent: Jul. 17, 2012

(54) SEMICONDUCTOR LASER

(75) Inventors: Hisayoshi Kuramochi, Kanagawa (JP); Tomonori Hino, Tokyo (JP); Tatsuhiro Hirata, Kanagawa (JP); Yuta Yoshida, Miyagi (JP)

(73) Assignee: Sony Corporation, Tokyo (JP)

( * ) Notice: Subject to any disclaimer, the term of this patent is extended or adjusted under 35 U.S.C. 154(b) by 6 days.

(21) Appl. No.: 12/888,670

(22) Filed: Sep. 23, 2010

(65) Prior Publication Data

US 2011/0075693 A1    Mar. 31, 2011

(30) Foreign Application Priority Data

Sep. 30, 2009    (JP) .................................. 2009-228038

(51) Int. Cl.
*H01S 5/00* (2006.01)

(52) U.S. Cl. ................................................... 372/44.01

(58) Field of Classification Search ............... 372/44.01
See application file for complete search history.

(56) References Cited

U.S. PATENT DOCUMENTS

| | | | |
|---|---|---|---|
| 6,444,998 B1* | 9/2002 | Taniguchi et al. | 257/13 |
| 6,630,366 B2* | 10/2003 | Taniguchi et al. | 438/34 |
| 2003/0179795 A1* | 9/2003 | Moriya et al. | 372/46 |
| 2007/0286252 A1* | 12/2007 | Ha et al. | 372/50.12 |
| 2010/0111129 A1* | 5/2010 | Nakashima et al. | 372/46.012 |

FOREIGN PATENT DOCUMENTS

| | | |
|---|---|---|
| JP | 2000-269601 | 9/2000 |
| JP | 2005-109060 | 4/2005 |

* cited by examiner

*Primary Examiner* — Jessica Stultz
*Assistant Examiner* — Tuan Nguyen
(74) *Attorney, Agent, or Firm* — SNR Denton US LLP

(57) ABSTRACT

The present invention provides a semiconductor laser realizing reduced possibility that a wiring layer disposed in the air is broken even under severe environment of a large temperature difference. A trench is provided between adjacent ridges, and a wiring layer electrically connecting an upper electrode and a pad electrode is disposed in the air at least above the trench. The wiring layer in a portion above the trench has a flat shape or a concave shape which dents toward the trench. With the configuration, accumulation of strains in the wiring layer when the wiring layer repeats expansion and shrink under severe environment of a large temperature difference is suppressed.

9 Claims, 8 Drawing Sheets

| METAL MATERIAL | YOUNG'S MODULUS (MPa) | LINEAR EXPANSION COEFFICIENT ($10^{-6}$/K) |
|---|---|---|
| Au | 78000 | 14.2 |
| Ti | 110000 | 8.0 |
| Ni | 207000 | 12.8 |
| Pt | 168000 | 8.9 |
| Pd | 110000 | 10.6 |
| Rh | 359000 | 9.6 |
| Mo | 324000 | 5.1 |
| Co | 211000 | 12.6 |
| Fe | 20000 | 13.8 |
| Cr | 248000 | 8.4 |

SEMICONDUCTOR LASER

BACKGROUND OF THE INVENTION

1. Field of the Invention

The present invention relates to a semiconductor laser in which emitters are driven independently of one another.

2. Description of the Related Art

In a semiconductor laser, to drive emitters independently of one another, an isolation trench for electrically isolating adjacent emitters is provided between the adjacent emitters. The width of the isolation trench is, though it varies depending on the types of lasers, only a few μm in the case of a laser of a narrow-pitch type in which a beam pitch is tens μm. Consequently, in such a case, it is extremely difficult to provide a wiring layer that couples a stripe electrode on an emitter (ridge) sandwiched by isolation trenches and a pad electrode formed in a place apart from the ridge in the narrow isolation trench. Therefore, for example, as described in Japanese Unexamined Patent Application Publication No. 2000-269601, generally, an insulating material is buried in the isolation trench, and the wiring layer is provided on the insulating material.

SUMMARY OF THE INVENTION

However, in the case of burying an isolation trench with an insulation material, stress is applied on the ridge due to shrinkage and strain of the buried insulating material, and the plane of polarization of a laser beam emitted from the ridge tends to rotate. In the case where a deep isolation trench is formed, a process of filling with the insulating material becomes complicated, and a problem of increase in cost occurs.

To address the problem, therefore, for example, it is considered to dispose the wiring layer in the air at least above the trench without burying the isolation trench with an insulating material and to form a portion disposed in the air of the wiring layer in an arch shape. In such a case, the possibility that the wiring layer is bent under its own weight is reduced. However, when an Au layer included in the wiring layer repeatedly expands and shrinks under severe environment of a large temperature difference (for example, environment having a temperature difference of −40° C. to +150° C.), strain is accumulated in the Au layer, and there is the possibility that the wiring layer is broken.

It is therefore desirable to provide a semiconductor laser realizing reduced possibility that a wiring layer disposed in the air is broken even under severe environment of a large temperature difference.

A semiconductor laser according to an embodiment of the present invention has a plurality of band-shaped ridges each including, at least, a lower cladding layer, an active layer, and an upper cladding layer in this order. The plurality of ridges is disposed in parallel to one another via band-shaped trenches. An upper electrode electrically connected to the upper cladding layer is provided on the top surface of each of the ridges. A wiring layer is electrically connected to the upper electrode. The wiring layer is disposed in the air at least above the trench. In a part different from the ridges and the trenches, a pad electrode is provided. The pad electrode is electrically connected to the upper electrode via the wiring layer. The wiring layer has an adhesion layer for enhancing adhesion to the top surface of the ridge, an Au layer, and a strain suppression layer for suppressing occurrence of a strain in the Au layer in order from the ridges.

In the semiconductor laser according to an embodiment of the invention, the trench is provided between adjacent ridges, and the wiring layer electrically connecting the upper electrode and the pad electrode is disposed in the air at least above the trench. In other words, in the laser, no filling material such as an insulating material is provided in a gap between the wiring layer and the inner wall of the trench. Consequently, there is no possibility that a stress which is applied when a filling material such as an insulating material is provided in the gap between the wiring layer and the inner wall of the trench is applied to the ridge. Further, the wiring layer is provided with a strain suppression layer for suppressing occurrence of strain in the Au layer. With the configuration, accumulation of strains in the Au layer when the Au layer repeats expansion and shrink under severe environment of a large temperature difference is suppressed.

A semiconductor laser according to an embodiment of the present invention has a plurality of band-shaped ridges each including, at least, a lower cladding layer, an active layer, and an upper cladding layer in this order. The plurality of ridges is disposed in parallel to one another via band-shaped trenches. An upper electrode electrically connected to the upper cladding layer is provided on the top surface of each of the ridges, and a wiring layer is electrically connected to the upper electrode. The wiring layer is disposed in the air at least above the trench. A pad electrode is provided in a part different from both of the ridges and the trenches. The pad electrode is electrically connected to the upper electrode via the wiring layer. The wiring layer in a portion above the trench has a flat shape or a concave shape which dents toward the trench.

In the semiconductor laser according to the embodiment of the invention, the trench is provided between adjacent ridges, and the wiring layer electrically connecting the upper electrode and the pad electrode is disposed in the air at least above the trench. In other words, in the laser, no filling material such as an insulating material is provided in a gap between the wiring layer and the inner wall of the trench. Consequently, there is no possibility that a stress which is applied when a filling material such as an insulating material is provided in the gap between the wiring layer and the inner wall of the trench is applied to the ridge. Further, the wiring layer in a portion above the trench has a flat shape or a concave shape which dents toward the trench. With the configuration, accumulation of strains in the wiring layer when the wiring layer repeats expansion and shrink under severe environment of a large temperature difference is suppressed.

In a semiconductor laser according to an embodiment of the present invention, a stress which is applied when a filling material such as the insulating material is provided in the gap between the wiring layer and the inner wall of the trench is prevented from being applied to the ridge, so that rotation of the plane of polarization caused by the stress applied on the ridge is suppressed. In the case of forming the wiring layer by deposition, in a manufacturing process, there is no possibility that the wiring layers are in contact with each other, and deterioration in reliability caused by ultrasound occurs. Therefore, the ridges are driven independently of one another and, without deteriorating reliability, rotation of the angle of polarization caused by the stress applied on the ridge is suppressed. Further, according to the embodiment of the invention, accumulation of strains in the Au layer when the Au layer repeats expansion and shrink under severe environment is suppressed. Thus, the possibility that the wiring layer is broken is reduced.

In a semiconductor laser according to an embodiment of the present invention, a stress which is applied when a filling material such as the insulating material is provided in the gap between the wiring layer and the inner wall of the trench is prevented from being applied to the ridge. Therefore, rotation of the plane of polarization caused by the stress applied on the ridge is suppressed. In the case of forming the wiring layer by deposition, in a manufacturing process, there is no possibility that the wiring layers are in contact with each other, and deterioration in reliability caused by ultrasound occurs. Therefore, the ridges are driven independently of one another and, without deteriorating reliability, rotation of the plane of polarization caused by the stress applied on the ridge is suppressed. Further, according to the embodiment of the invention, accumulation of strains in the wiring layer when the wiring layer repeats expansion and shrink under severe environment is suppressed. Thus, the possibility that the wiring layer is broken is reduced.

Other and further objects, features and advantages of the invention will appear more fully from the following description.

DETAILED DESCRIPTION OF THE PREFERRED EMBODIMENTS

Modes for carrying out the invention will be described in detail below with reference to the drawings. The description will be given in the following order.

Figure 1:
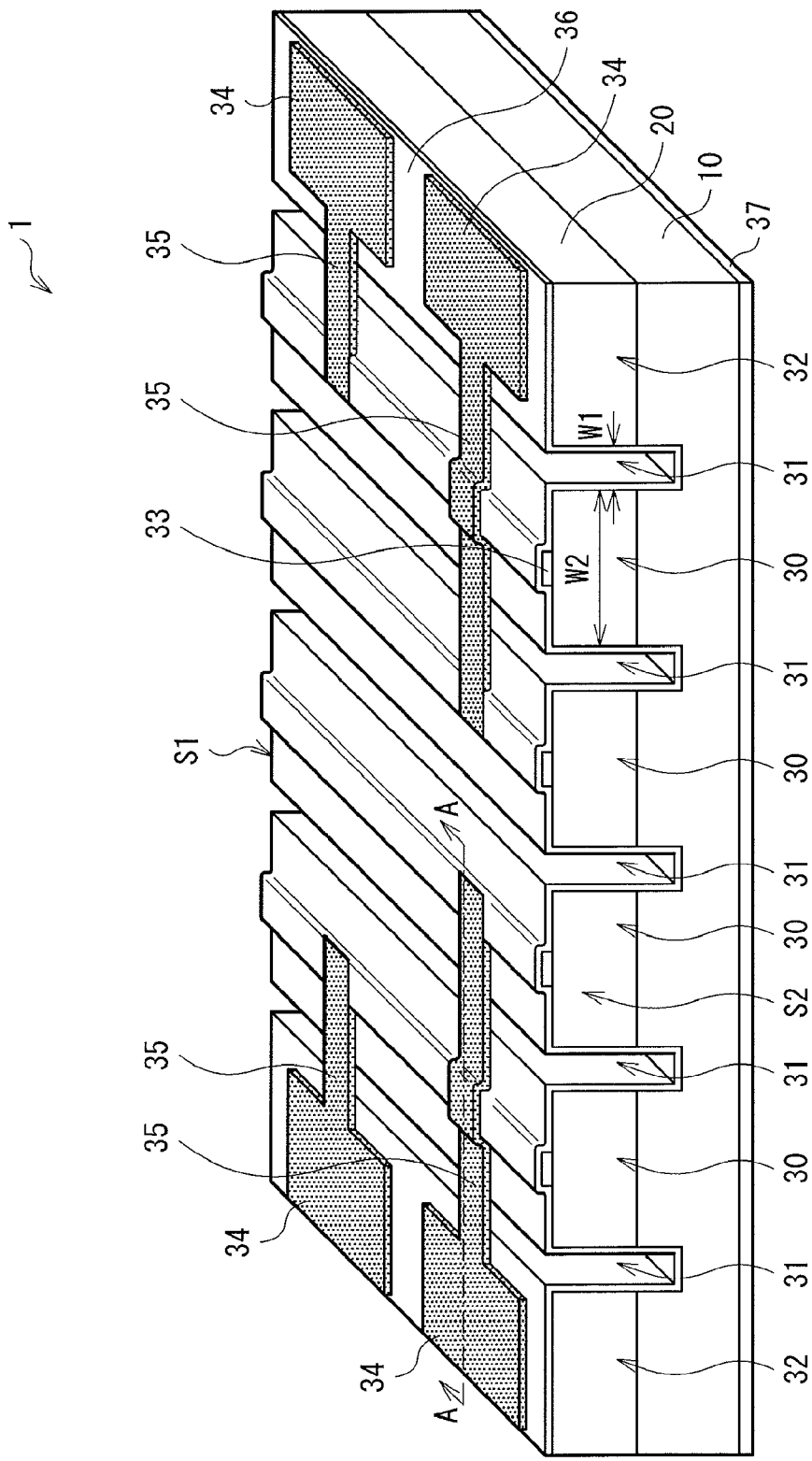
FIG. 1 is a perspective view of a semiconductor laser according to a first embodiment of the present invention.
Figure 2:
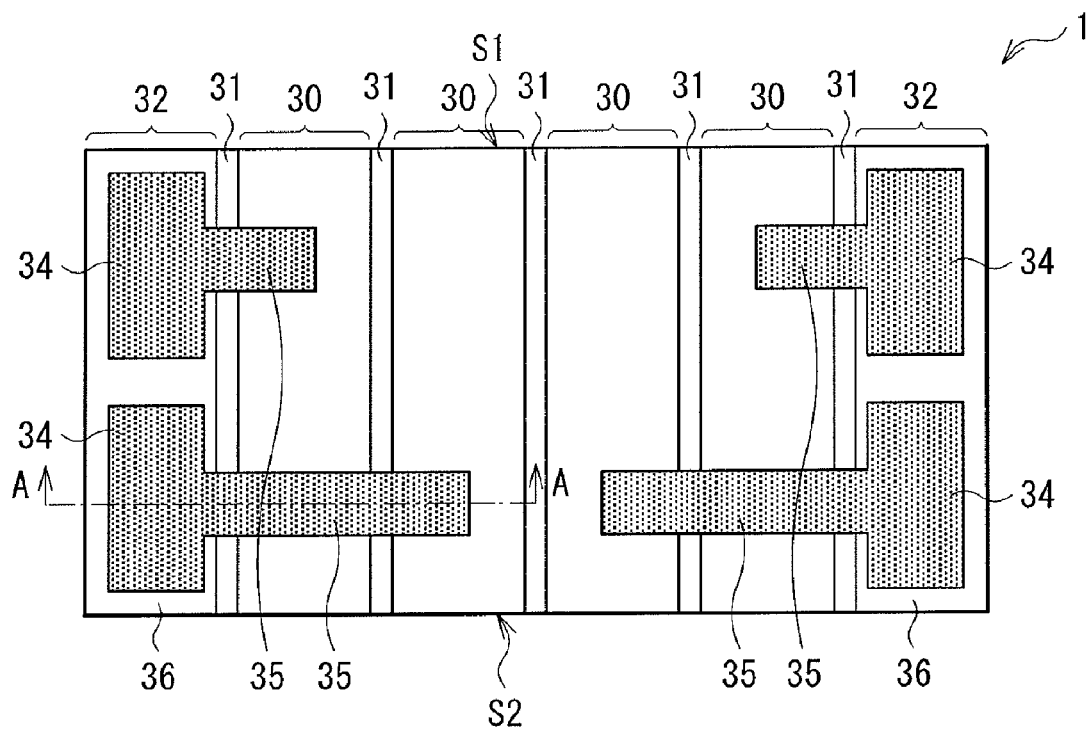
FIG. 2 is a top view of the semiconductor laser in FIG. 1.
Figure 3:
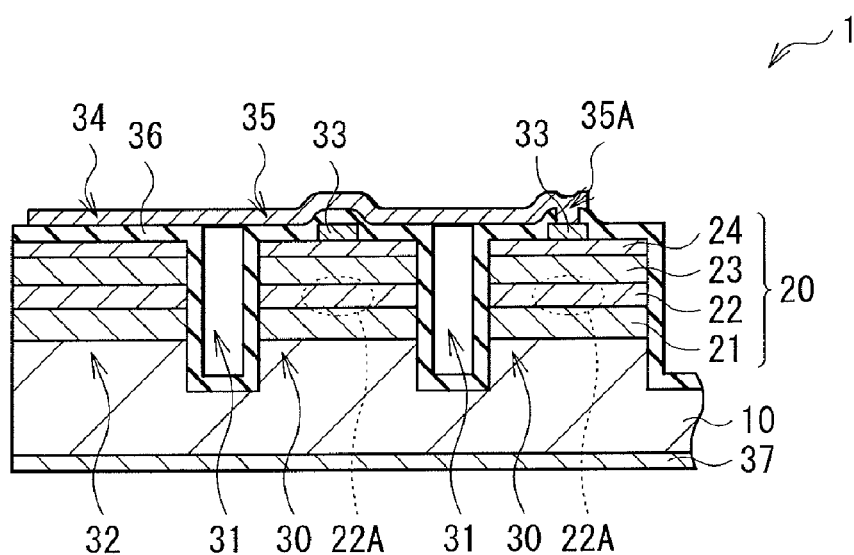
FIG. 3 is a cross section taken along line A-A of the semiconductor laser in FIG. 1 or 2.

1. First embodiment (FIGS. 1 to 8)
Example in which a wiring layer has a flat shape or a concave shape above a trench
2. Second embodiment (FIGS. 9 to 11)
Example in which a wiring layer has an arch shape above a trench
Example in which a distortion suppression layer is provided as the uppermost layer in a wiring layer
3. Modification of the second embodiment
Example in which a wiring layer has a flat shape or a concave shape above a trench
4. Examples First Embodiment FIG. 1 is a perspective view illustrating an example of a schematic configuration of a semiconductor laser 1 according to a first embodiment of the present invention. FIG. 2 illustrates an example of the configuration of a top surface of the semiconductor laser 1 in FIG. 1. FIG. 3 illustrates an example of a sectional configuration taken along line A-A of the semiconductor laser 1 in FIG. 1 or 2. The semiconductor laser 1 of the embodiment is a multi-beam semiconductor laser having a plurality of stripe-shaped emitters and an edge-emitting semiconductor laser for emitting a laser beam from end surfaces of the emitters.

The semiconductor laser 1 has, for example, a semiconductor layer 20 on a substrate 10. The semiconductor layer 20 includes, for example, as illustrated in FIG. 3, a lower cladding layer 21, an active layer 22, an upper cladding layer 23, and a contact layer 24 in order from the substrate 10 side. Although not illustrated, the semiconductor layer 20 may be further provided with layers (for example, a buffer layer, a guide layer, and the like) other than the above-described layers. A plurality of band-shaped ridges 30 are disposed in parallel to one another in the semiconductor layer 20, and function as emitters that emit laser beams independently of one another from a front end surface S1. Although the case where four ridges 30 are provided is illustrated as an example in FIGS. 1 to 3, two or three ridges 30 may be provided or five or more ridges 30 may be provided.

Both side surfaces of each of the ridges 30 excluding at least the ridges 30 at both ends in the arrangement direction out of the ridges 30 provided in an upper part of the semiconductor layer 20 are sandwiched by a band-shaped trench 31. For example, as illustrated in FIGS. 1 and 2, band-shaped bases 32 having a height equivalent to that of the ridges 30 are provided at both ends in the arrangement direction of the ridges 30. Both side surfaces of all of the ridges 30 are sandwiched by the band-shaped trenches 31. The trench 31 reaches, for example, as illustrated in FIGS. 1 and 2, the top of the substrate 10. With the configuration, the ridges 30 adjacent with each other are spatially isolated by the trench 31. The trench 31 does not reach the substrate 10, and the adjacent ridges 30 may not be completely spatially isolated by the trench 31. In this case, preferably, the trench 31 has a depth to a degree that electric crosstalk does not occur between adjacent ridges 30 (for example, a depth reaching the lower cladding layer 21).

Width W1 of the trench 31 (width in the direction orthogonal to the extension direction of the trench 31) is smaller than width W2 of the ridge 30 (width in a direction orthogonal to the extension direction (resonator direction) of the ridge 30). Concretely, when the width W2 of the ridge 30 is tens μm (for example, 30 μm), the width W1 of the trench 31 is a few μm (for example, 3 μm). In other words, the semiconductor laser 1 of the embodiment is a laser of a narrow pitch type having a beam pitch of tens μm.

In the semiconductor layer 20, a pair of a front end surface S1 and a rear end surface S2 sandwiching the ridge 30 in the extending direction of the ridge 30 are formed. The pair of the front end surface S1 and the rear end surface S2 constructs a resonator. The pair of front end surface S1 and the rear end surface S2 is formed by, for example, cleavage, and the front end surface S1 and the rear end surface S2 are disposed so as to be opposed to each other via a predetermined gap. A low-reflection film (not illustrated) is formed on the front end surface S1, and a high-reflection film (not illustrated) is formed on the rear end surface S2.

The ridge 30 includes, for example, at least an upper part of the lower cladding layer 21, the active layer 22, the upper cladding layer 23, and the contact layer 24. The ridge 30 includes, for example, as illustrated in FIG. 3, an upper part of the substrate 10, the lower cladding layer 21, the active layer 22, the upper cladding layer 23, and the contact layer 24.

The substrate 10 is made of, for example, p-type GaAs. Examples of the p-type impurity are magnesium (Mg) and zinc (Zn). The lower cladding layer 21 is made of, for example, p-type AlInP. The active layer 22 is made of, for example, undoped GaInP. In the active layer 22, a band-shaped region including a region opposed to an upper electrode 33 which will be described later serves as a light emitting region 22A. The light emitting region 22A corresponds to a current injection region in which current from the upper electrode 33 is injected. The upper cladding layer 23 is made of, for example, n-type AlInP, and the contact layer 24 is made of, for example, n-type GaAs. Examples of the n-type impurity are silicon (Si) and selenium (Se).

The upper electrode 33 is provided on the top surface of each ridge 30 (the top surface of the contact layer 24). The upper electrode 33 has, for example, as illustrated in FIGS. 1 and 3, a band shape extending in the extension direction of the ridge 30 and is electrically connected to the contact layer 24 and the upper cladding layer 23. At least one of two regions sandwiching the ridges 30 and the trenches 31 from sides is provided with a pad electrode 34. For example, each of the two bases 32 sandwiching the ridges 30 and the trenches 31 from sides is provided with the pad electrode 34. An insulating layer 36 is provided between the pad electrode 34 and the base 32, and the pad electrode 34 is isolated from the base 32 (particularly, the lower cladding layer 21). In the case where current hardly flows in a place between the pad 34 and the lower cladding layer 21 such as a case that resistance in a portion just below the pad electrode 34 in the base 32 is high, the insulating layer 36 between the pad electrode 34 and the base 32 may not be provided. The pad electrode 34 is connected to a wiring layer 35 which will be described later.

The insulating layer 36 is provided as necessary also on the surface of the ridge 30 and the surface of the trench 31. The insulating layer 36 has, for example, as illustrated in FIG. 3, an opening 35A corresponding to a front end portion of the wiring layer 35. The wiring layer 35 is electrically connected to, for example, via the opening 35A to the upper electrode 33, and a portion other than the portion which is in contact with the upper electrode 33 in the wiring layer 35 is in contact with the surface of the insulating layer 36. The pad electrode 34 is electrically connected to the upper electrode 33, for example, via the wiring layer 35.

Figure 4:
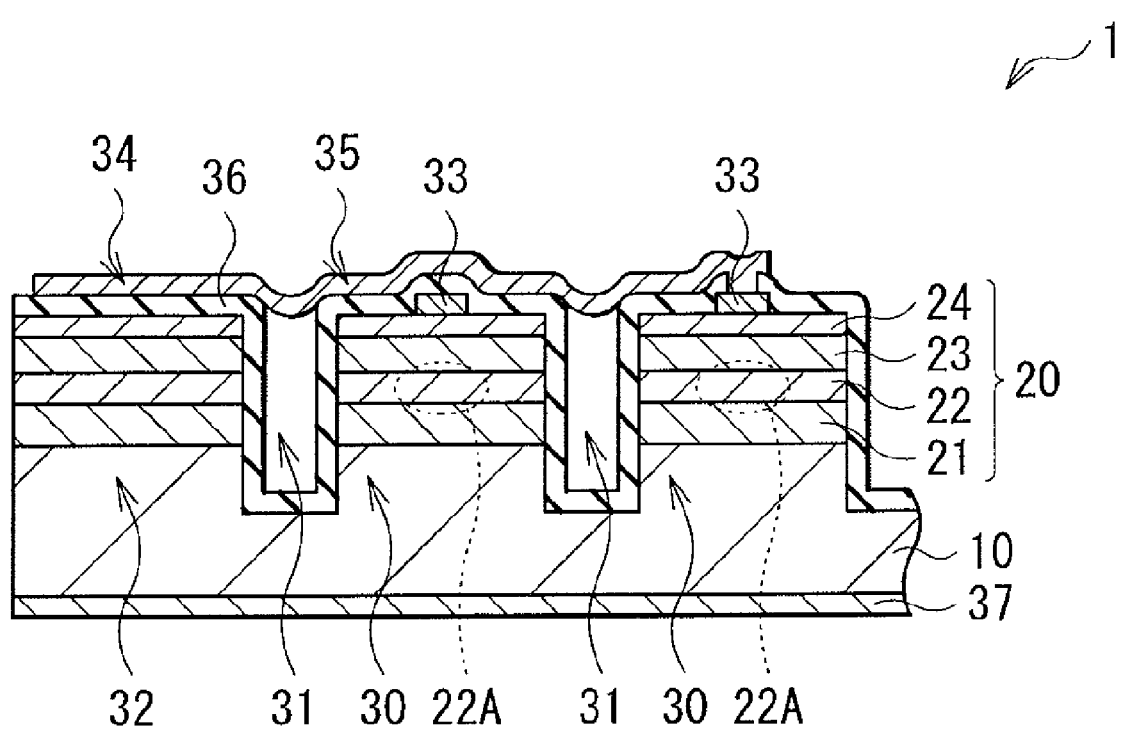
FIG. 4 is a cross section of a modification of the semiconductor laser in FIG. 1.

The wiring layer 35 is connected to the upper electrode 33 on the ridge 30 and the pad electrode 34 to electrically connect them. For example, as illustrated in FIGS. 1 to 3, the wiring layer 35 has a band shape extending in a direction crossing (for example, orthogonal to) the extension direction of the ridge 30 and the trench 31 and is formed by deposition. The wiring layer 35 extends, for example, over each of the trenches 31 and is disposed in the air at least above the trench 31. The portion disposed in the air in the wiring layer 35 has, for example, as illustrated in FIGS. 1 and 3, a flat shape. The portion disposed in the air in the wiring layer 35 may have, for example, as illustrated in FIG. 4, a concave shape which dents toward the trench 31 side.

A lower electrode 37 is provided on the rear surface of the substrate 10. The lower electrode 37 is formed, for example, on the entire rear surface of the substrate 10 and is electrically connected to the substrate 10. Like the upper electrode 33, the lower electrode 37 may be provided separately for each of the ridges 30.

The upper electrode 33 is constructed by stacking, for example, an alloy layer of gold (Au) and germanium (Ge), a nickel (Ni) layer, and a gold (Au) layer in order on the top surface side of the ridge 30. The pad electrode 34 and the wiring layer 35 are constructed by stacking, for example, a titanium (Ti) layer, a platinum (Pt) layer, and a gold (Au) layer in order on the top surface side of the ridge 30. The Ti layer and the Pt layer have the function of an adhesion layer that enhances adhesion to the top surface of the ridge 30. The upper electrode 33, the pad electrode 34, and the wiring layer 35 may be a stacked body made of materials other than the above-described materials. The upper electrode 33, the pad electrode 34, and the wiring layer 35 may be formed of the same material or materials different from one another. The insulating layer 36 is made of, for example, SiN, SiO$_2$, SiON, Al$_2$O$_3$, or AlN. The lower electrode 37 is constructed by, for example, stacking Ti, Pt, and Au in order on the substrate 10 side.

Next, with reference to FIGS. 5A and 5B to FIG. 8, an example of a method of manufacturing the semiconductor laser 1 of the embodiment will be described. FIGS. 5A and 5B to FIG. 8 are perspective views of devices in manufacturing process.

Figure 5A:
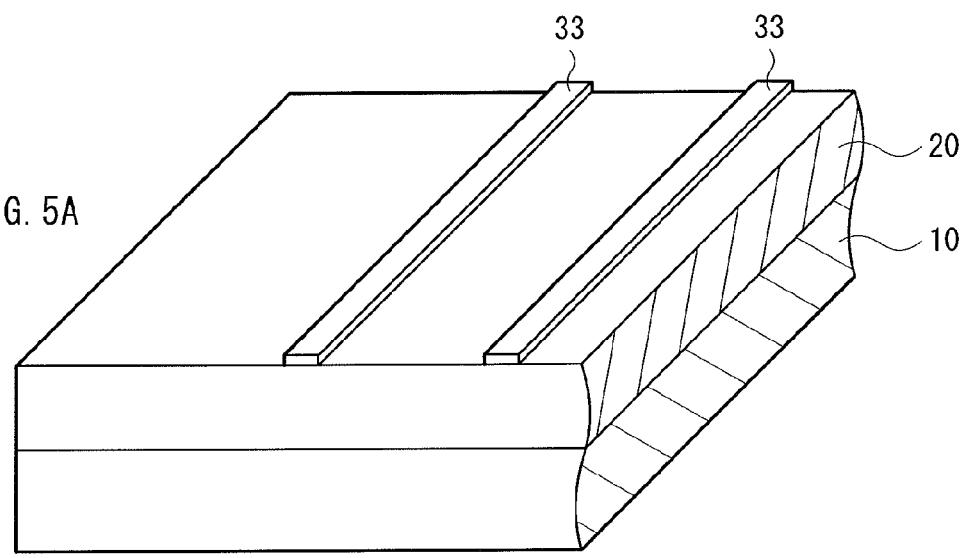
FIGS. 5A and 5B are perspective views for explaining an example of a method of manufacturing the semiconductor laser in FIG. 1.
Figure 5B:
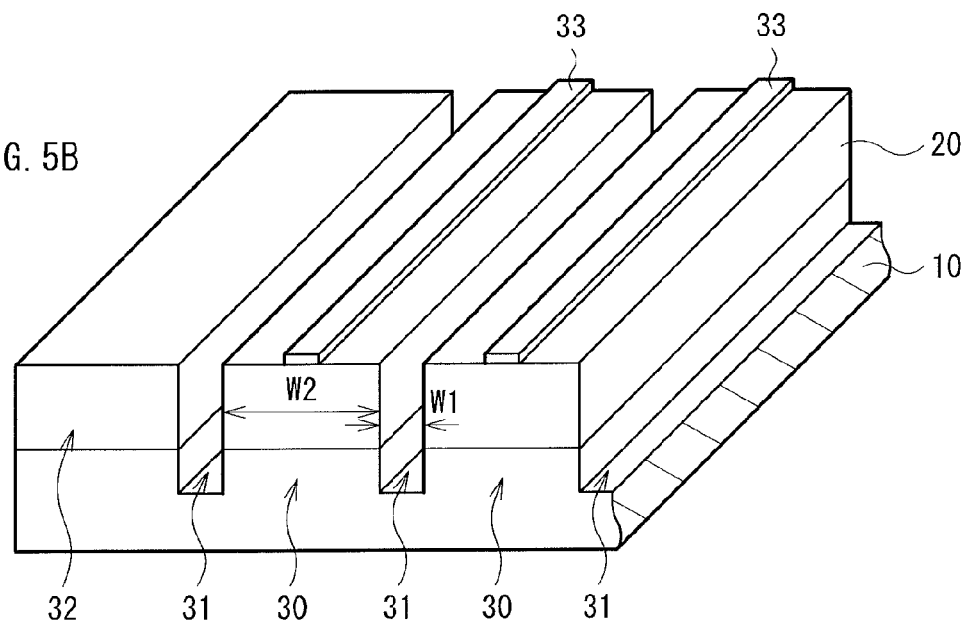

First, the semiconductor layer 20 is formed on the substrate 10 and a plurality of band-shaped upper electrodes 33 are then formed on the semiconductor layer 20 at predetermined pitches in parallel to each other (FIG. 5A). Subsequently, the band-shape trenches 31 extending in the extension direction of the upper electrode 33 are formed on both sides of the upper electrode 33, and a plurality of ridges 30 are formed in the semiconductor layer 20 (FIG. 5B). The ridges 30 and the trenches 31 are formed so that the width W1 of the trench 31 is smaller than the width W2 of the ridge 30.

Figure 6A:
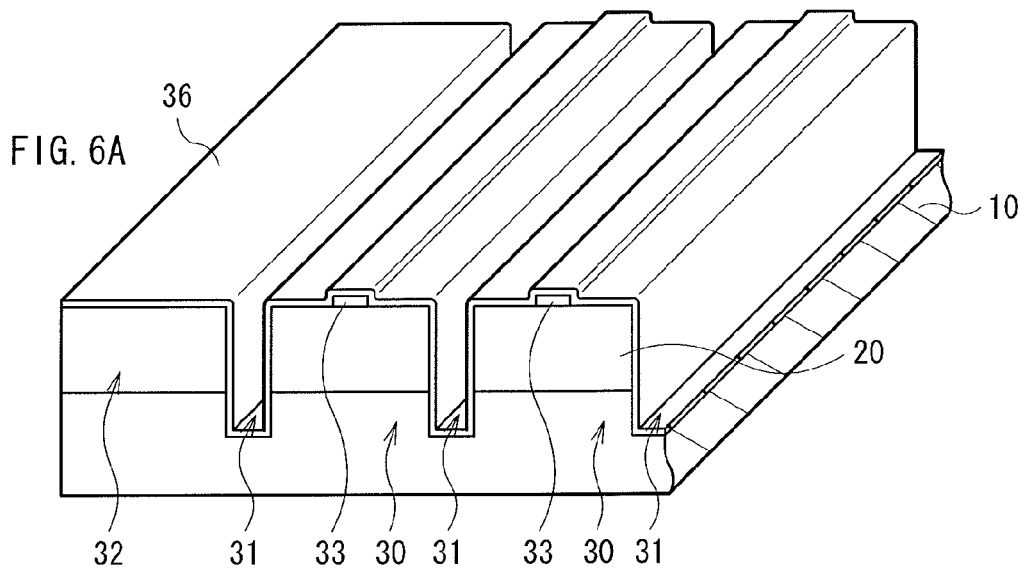
FIGS. 6A and 6B are perspective views for explaining a process subsequent to FIGS. 5A and 5B.
Figure 6B:
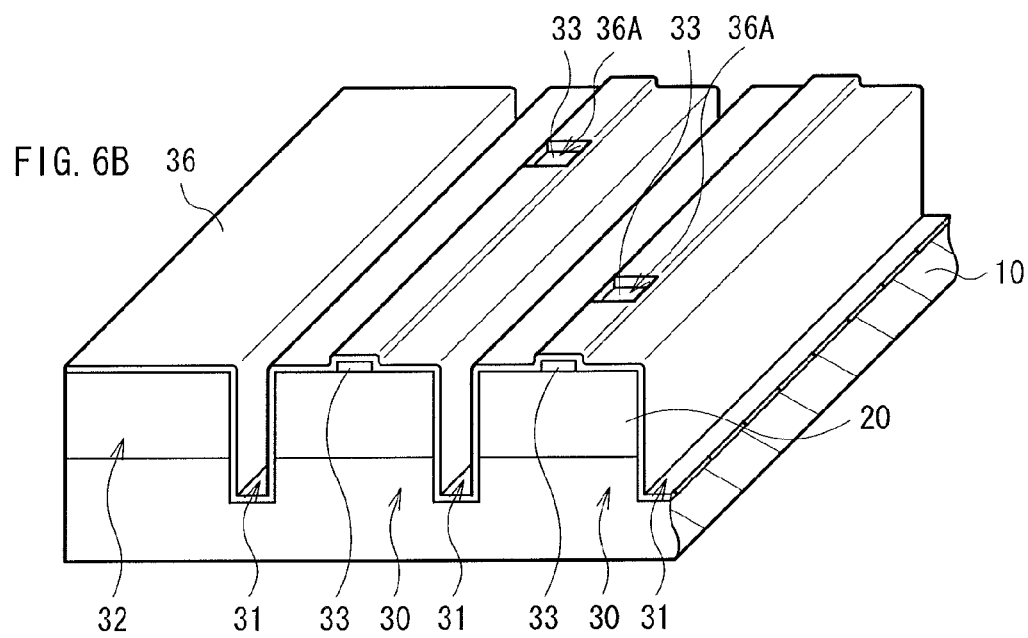
Figure 7A:
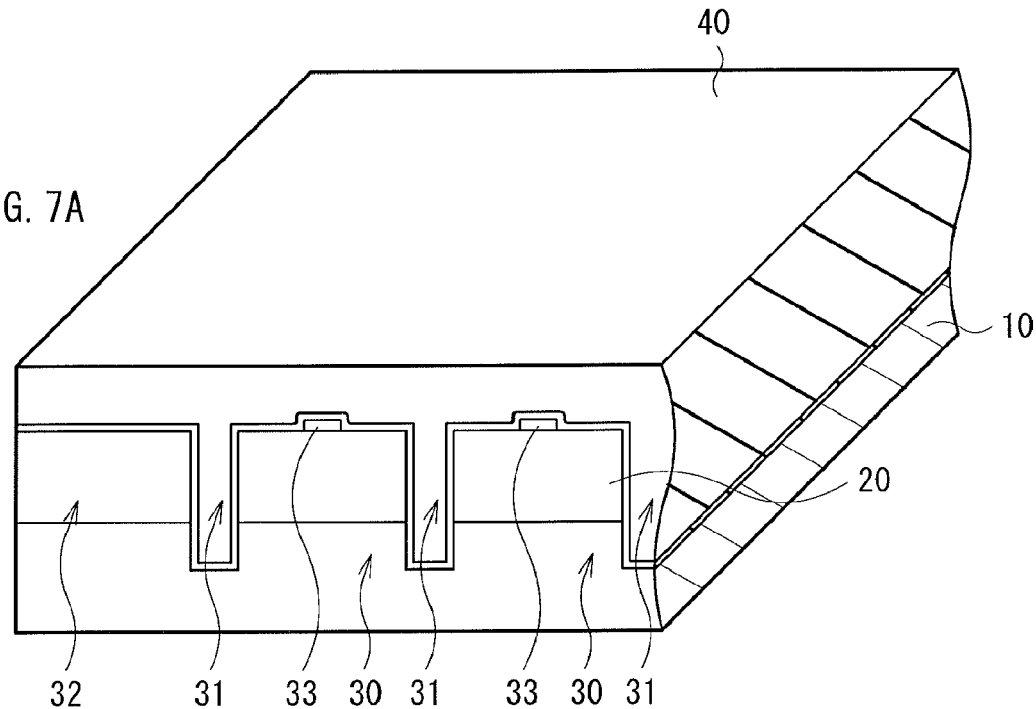
FIGS. 7A and 7B are perspective views for explaining a process subsequent to FIGS. 6A and 6B.
Figure 7B:
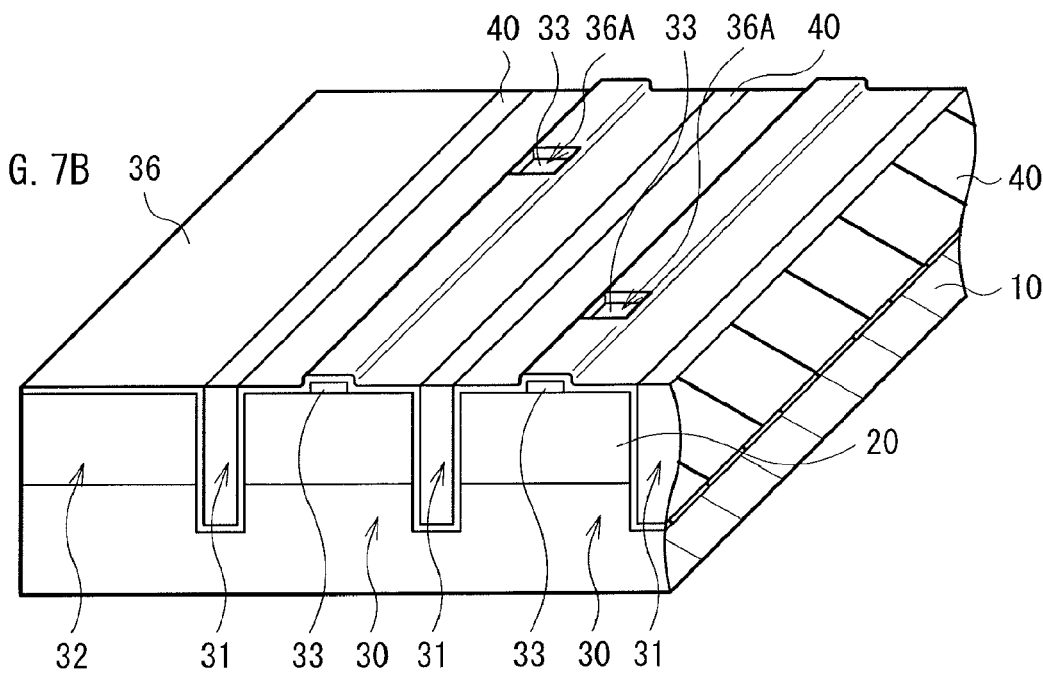

The insulating layer 36 is formed on the entire surface (FIG. 6A) and openings 36A are then formed in predetermined positions (FIG. 6B). A part of the upper electrode 33 is exposed from each of the openings 36A. Next, a resist layer 40 is formed on the entire surface (FIG. 7A). Preferably, the resist layer 40 is formed so that the trenches 31 are completely buried. Subsequently, the resist layer 40 is exposed and developed so that the resist layer 40 remains at least in the trenches 31. For example, by dry etching, the top surface of the portion corresponding to the trench 31 in the resist layer 40 comes to be a flat face or a concave face which dents toward the bottom surface of the trench 31. Further, the resist layer 40 is prevented from remaining in the opening 36A.

Next, for example, although not illustrated, a metal layer 42 is formed on the entire surface by evaporation or the like. By forming a part of the metal layer 42 on the surface of the remaining resist layer 40 as necessary, the portion corresponding to the trench 31 in the metal layer 42 comes to have a flat shape or a concave shape which dents toward the bottom surface side of the trench 31.

Figure 8:
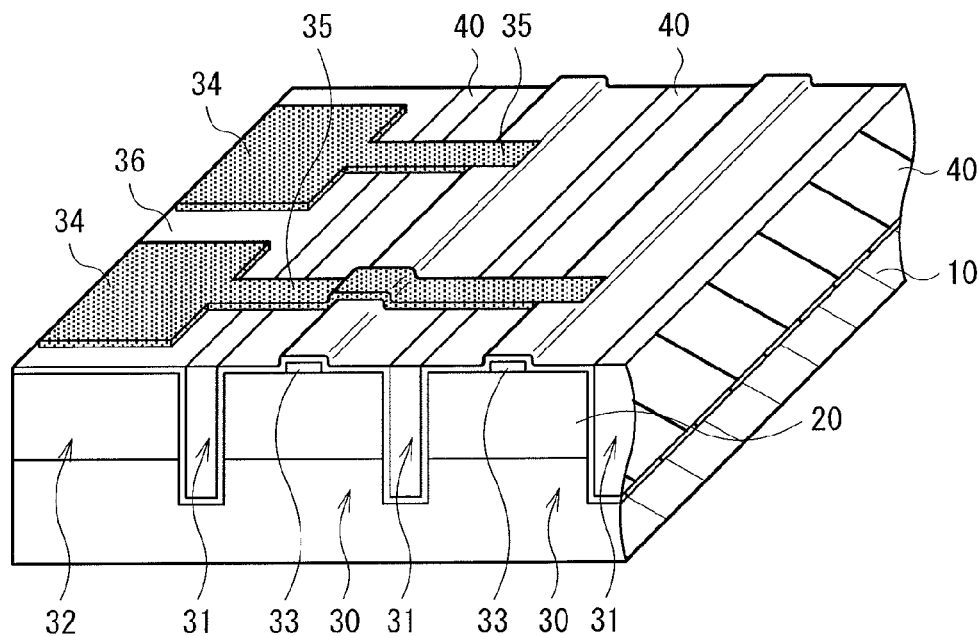
FIG. 8 is a perspective view for explaining a process subsequent to FIGS. 7A and 7B.

By removing an unnecessary portion in the metal layer 42 together with the resist layer 40 by using, for example, the liftoff technique, the pad electrodes 34 and the wiring layers 35 are formed (FIG. 8). Further, the remained resist layer 40 is removed by a predetermined method. As a result, the wiring layer 35 is formed in the flat shape or in the concave shape which dents toward the bottom surface side of the trench 31 and in the air at least above the trench 31. Next, the lower electrode 37 is formed on the rear surface of the substrate 10. In such a manner, the semiconductor laser 1 of the embodiment is manufactured.

Next, the operation and effect of the semiconductor laser 1 of the embodiment will be described.

In the semiconductor laser 1 of the embodiment, when a predetermined voltage is applied across the upper electrode 33 and the lower electrode 37, current is injected to the current injection region (light emitting region 22A) in the active layer 22, and light is emitted because of recombination of electrons and holes. The light is reflected by the pair of the front end surface S1 and the rear end surface S2, laser oscillation is caused at a predetermined wavelength, and the resultant light is emitted as a laser beam from the front end surface S1 of each of the ridges 30 to the outside.

In the embodiment, the trench 31 is provided between the ridges 30 adjacent to each other. Further, the wiring layer 35 electrically connecting the upper electrode 33 and the pad electrode 34 is disposed in the air at least above the trench 31. In other words, in the embodiment, no filling material such as the insulating material is provided in a gap between the wiring layer 35 and the inner wall of the trench 31. Consequently, there is no possibility that a stress which is applied when a filling material such as the insulating material is provided in the gap between the wiring layer 35 and the inner wall of the trench 31 is applied to the ridge 30, so that rotation of the angle of polarization caused by the stress applied on the ridge 30 is suppressed.

The semiconductor laser 1 of the embodiment is a laser of a narrow pitch type in which the beam pitch is tens μm. Consequently, it is extremely difficult to form the wiring layer 35 by wire bonding. If the wiring layer 35 is formed by wire bonding, the possibility that one wire ball is in contact with a plurality of upper electrodes 33 and the ridges 30 are not driven independently of one another is high. Since ultrasonic bonding is used in the wire bonding, deterioration in reliability due to ultrasonic may be caused. In the embodiment, therefore, the wiring layer 35 is formed by deposition. It prevents a situation such that, since the wiring layers 35 are in contact with each other, the ridges 30 are not driven independently of one another, and deterioration in reliability caused by ultrasonic occurs.

In the embodiment, the wiring layer 35 has a flat shape or a concave shape which dents toward the trench side above the trench 31. With the configuration, accumulation of strains in the wiring layer 35 when the wiring layer 35 repeats expansion and shrink under severe environment of a large temperature difference is suppressed. As a result, the possibility that the wiring layer is broken is reduced. As a method of forming the wiring layer 35 in a flat shape or a concave shape which dents toward the trench side, as described above, for example, it is preferable to selectively remove the resist layer 40 by dry etching. By the method, the wiring layer 35 is easily formed in the flat shape or the concave shape which dents toward the trench side.

Second Embodiment

Figure 9:
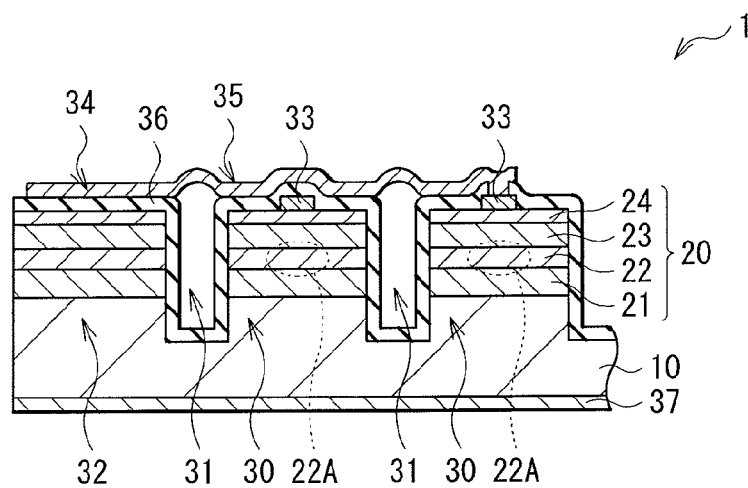
FIG. 9 is a cross section of a semiconductor laser according to a second embodiment of the present invention.

FIG. 9 illustrates an example of a sectional configuration of a semiconductor laser 2 according to a second embodiment of the present invention. FIG. 9 corresponds to a sectional configuration of the semiconductor laser 2 of the embodiment taken along line A-A in FIG. 1 or 2. Like the semiconductor laser 1 of the first embodiment, the semiconductor laser 2 of the embodiment is a multi-beam semiconductor laser having a plurality of stripe-shaped emitters, and is an edge-emitting semiconductor laser for emitting a laser beam from end surfaces of the emitters.

The semiconductor laser 2 is different from the semiconductor laser 1 with respect to the points that a portion disposed in the air of the wiring layer 35 has, for example, an arch shape projected to the side opposite to the bottom surface of the trench 31 as illustrated in FIG. 9 and, further, the wiring layer 35 is provided with a special layer (strain suppression layer). In the following, the points different from the configuration of the semiconductor laser 1 will be mainly described, and description of the points common to the configuration of the semiconductor laser 1 will be appropriately omitted.

Figures 10, 11:
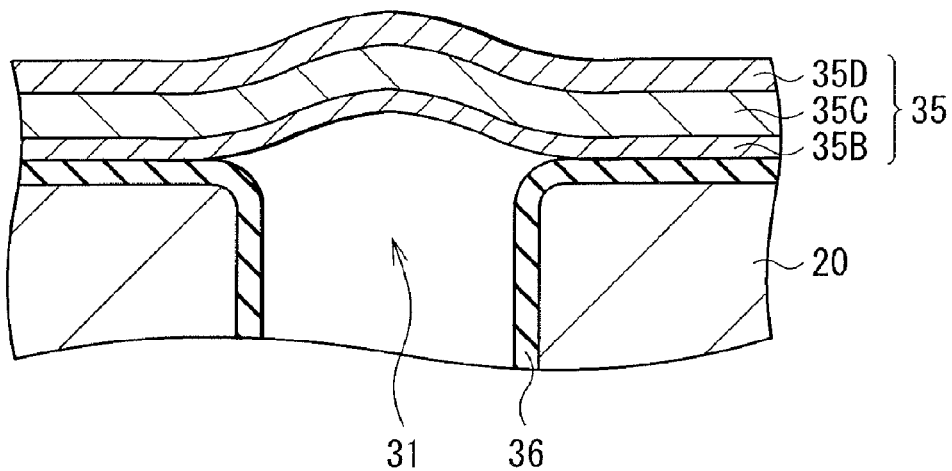
FIG. 10 is a cross section of a periphery of trenches in the semiconductor laser in FIG. 9.
FIG. 11 is a table illustrating physical values of materials used for a distortion suppression layer in FIG. 10.

As described above, in the second embodiment, a portion disposed in the air of the wiring layer 35 has, for example, as illustrated in FIG. 9, an arch shape projected to the side opposite to the bottom surface of the trench 31, and the possibility that the wiring layer 35 is bent is reduced. Further, for example, as illustrated in FIG. 10, the wiring layer 35 has, at least in a portion disposed in the air of the wiring layer 35, an adhesion layer 35B for enhancing adhesion to the top surface of the ridge 30, an Au layer 35C having high conductivity, and a strain suppression layer 35D for suppressing occurrence of strain in the Au layer 35C in order from the trench 31 side. In other words, in the embodiment, the wiring layer 35 has the strain suppression layer 35D as the uppermost layer.

The adhesion layer 35B is constructed by stacking, for example, Ti and Pt in order on the top surface side of the ridge 30. The Au layer 35C is constructed by, for example, containing Au. The strain suppression layer 35D is made of, for example, a metal material having higher Young's modulus and lower linear expansion coefficient than those of Au. Examples of the metal material having higher Young's modulus and lower linear expansion coefficient than those of Au include, as illustrated in FIG. 11, Ti, Ni, Pt, Pd, Rh, Mo, Co, Fe, and Cr. Therefore, the strain suppression layer 35C is preferably made of, for example, at least one of the metal materials of Ti, Ni, Pt, Pd, Rh, Mo, Co, Fe, and Cr. The strain suppression layer 35D has a thickness to a degree that occurrence of strain in the Au layer 35C is suppressed. When the Au layer 35C has a thickness of, for example, a few μm, the strain suppression layer 35D has a thickness equal to or lager than 10 nm, for example.

Next, an example of a method of manufacturing the semiconductor laser 2 of the embodiment will be described. First, in a manner similar to the foregoing embodiment, the semiconductor layer 20 is formed on the substrate 10 and a plurality of band-shaped upper electrodes 33 are then formed on the semiconductor layer 20 at predetermined pitches in parallel to each other. Subsequently, the band-shape trenches 31 extending in the extension direction of the upper electrode 33 are formed on both sides of the upper electrode 33, and a plurality of ridges 30 are formed in the semiconductor layer 20. The ridges 30 and the trenches 31 are formed so that the width W1 of the trench 31 is smaller than the width W2 of the ridge 30.

The insulating layer 36 is formed on the entire surface and the openings 36A are then formed in predetermined positions. A part of the upper electrode 33 is exposed from each of the openings 36A. Next, the resist layer 40 is formed on the entire surface. Preferably, the resist layer 40 is formed so that the trenches 31 are completely buried. Subsequently, the resist layer 40 is exposed and developed so that the resist layer 40 remains at least in the trenches 31. For example, by wet etching, the top surface of the portion corresponding to the trench 31 in the resist layer 40 is formed in an arch shape which projects toward the side opposite to the bottom surface of the trench 31. Further, the resist layer 40 is prevented from remaining in the opening 36A.

Next, for example, although not illustrated, an adhesion layer 135B, an Au layer 135C having high conductivity, and a strain suppression layer 135D suppressing occurrence of strain in the Au layer 135C are stacked in this order on the entire surface by evaporation or the like, thereby forming a metal layer 135. By forming a part of the metal layer 135 on the surface of the remaining resist layer 40 as necessary, the portion corresponding to the trench 31 in the metal layer 135 comes to have an arch shape which projects toward the side opposite to the bottom surface of the trench 31.

By removing an unnecessary portion in the metal layer 135 together with the resist layer 40 by using, for example, the liftoff technique, the pad electrodes 34 and the wiring layers 35 are formed. Further, the remaining resist layer 40 is removed by a predetermined method. As a result, the portion disposed in the air in the wiring layer 35 is formed in the arch shape which projects toward the side opposite to the bottom surface. Next, the lower electrode 37 is formed on the rear surface of the substrate 10. In such a manner, the semiconductor laser 2 of the embodiment is manufactured.

Next, the operation and effect of the semiconductor laser 2 of the embodiment will be described.

In the semiconductor laser 2 of the embodiment, when a predetermined voltage is applied across the upper electrode 33 and the lower electrode 37, current is injected to the current injection region (light emitting region 22A) in the active layer 22, and light is emitted by recombination of electrons and holes. The light is reflected by the pair of the front end surface S1 and the rear end surface S2, laser oscillation is caused at a predetermined wavelength, and the resultant light is emitted as a laser beam from the front end surface S1 of each of the ridges 30 to the outside.

In the embodiment, similar to the foregoing embodiment, the trench 31 is provided between the ridges 30 adjacent to each other and the wiring layer 35 electrically connecting the upper electrode 33 and the pad electrode 34 is disposed in the air at least above the trench 31. With the configuration, rotation of the plane of polarization caused by the stress applied on the ridge 30 is suppressed. In the embodiment, similar to the foregoing embodiment, the wiring layer 35 is formed by deposition. It prevents a situation such that, since the wiring layers 35 are in contact with each other, the ridges 30 are not driven independently of one another, and deterioration in reliability caused by ultrasonic occurs.

In the embodiment, at least a part disposed in the air in the wiring layer 35 is constructed by stacking the adhesion layer 35B, the Au layer 35C, and the strain suppression layer 35D in order from the trench 31 side. With the configuration, accumulation of strains in the Au layer 35C when the wiring layer 35 repeats expansion and shrink under severe environment of a large temperature difference is suppressed. As a result, the possibility that the wiring layer 35 is broken is reduced.

Modification of Second Embodiment

In the second embodiment, a portion disposed in the air in the wiring layer 35 has an arch shape which projects toward the side opposite to the bottom surface of the trench 31. For example, although not illustrated, the portion may have a flat shape or a concave shape which dents toward the trench side. Also in the case where the wiring layer 35 has such a shape, accumulation of strains in the Au layer 35C is suppressed, and the possibility that the wiring layer 35 is broken is reduced.

Example

Next, an example of the semiconductor lasers 1 and 2 according to the foregoing embodiments will be described in contrast with a comparative example. As an example of the semiconductor laser 1, the portion disposed in the air in the wiring layer 35 was formed in a flat shape, and a Ti layer, a Pt layer, and an Au layer were stacked in this order on the top surface side of the ridge 30. As an example of the semiconductor laser 2, the portion disposed in the air in the wiring layer 35 was formed in an arch shape which projects toward the side opposite to the bottom surface of the trench 31, and the adhesion layer 35B obtained by stacking a Ti layer and a Pt layer in this order from the trench 31 side, the Au layer 35C, and the strain suppression layer 35D made of Ti or Ni were stacked in this order from the trench 31 side. In a comparative example, the portion disposed in the air in the wiring layer 35 was formed in an arch shape which projects toward the side opposite to the bottom surface of the trench 31 and a Ti layer, a Pt layer, and an Au layer were stacked in this order from the trench 31 side.

In the comparative example, each time a temperature cycle of −40° C. to +85° C. is performed, a strain of $3.3 \times 10^{-3}$ was accumulated at the root portion of the arch shape in the Au layer. On the other hand, in the examples of the semiconductor lasers 1 and 2, even after the temperature cycle of −40° C. to +85° C. was performed twenty times, no strain occurred at the root portion of the air portion of the Au layer 35. It was understood that the possibility of occurrence of a disconnection failure as one of failure modes is extremely high in the comparative example and, on the other hand, extremely low in the examples.

Although the invention has been described above by the plurality of embodiments, the invention is not limited to the embodiments but can be variously modified.

For example, the case where the top surface of the ridge 30 has an almost flat shape has been described in each of the foregoing embodiments, although not illustrated, a shape that an end portion on the side of the trench 31 in the top surface of the ridge 30 is inclined may be employed. In this case, the root in the portion disposed in the air in the wiring layer 35 may be formed on the inclined portion (inclined surface) in the top surface of the ridge 30.

Although the case where the semiconductor laser 1 has the bases 32 provided on both sides of the ridge 30 has been described in the foregoing embodiments, the bases 32 may not be provided.

Although the case where each of the wiring layers 35 is uncovered has been described in each of the embodiments, for example, although not illustrated, the surface of at least the portion disposed in the air in each of the wiring layers 35 may be covered with an insulating film made of SiN or the like. It prevents ion migration and each of the wiring layers 35 is protected from the external environment.

In each of the foregoing embodiments, the case where the upper electrode 33 is formed in a process different from a process of forming the wiring layer 35 and the pad electrode 34 has been described. The upper electrode 33 may be formed together with the wiring layer 35 and the pad electrode 34 in the same process as the process of forming the wiring layer 35 and the pad electrode 34. In this case, the upper electrode 33 on the ridge 30 out of the center is formed in the same plane as the wiring layer 35 which is electrically connected to the upper electrode 33 on the ridge 30 in the center. It is therefore preferable to make the end portion on the side of the rear end surface S2 of the upper electrode 33 on the ridge 30 out of the center slightly recessed toward the front end surface S1 side and to dispose the wiring layer 35 which is electrically connected to the upper electrode 33 on the ridge 30 in the center, in a region obtained by the recess (that is, a region close to the rear end surface S2 in the top surface of the ridge 30). With the configuration, short-circuits on both sides is prevented and, in addition, the region in which no current is injected is formed in a place furthest from the light emission side, and the influence on the laser characteristics is minimized.

In the foregoing embodiments and the like, the present invention has been described using the AlGaAs compound semiconductor laser as an example. The invention is also applicable to other compound semiconductor lasers such as red semiconductor lasers of the AlGaInP compound, the GaInAsP compound, and the like, gallium nitride semiconductor lasers of the GaInN compound, the AlGaInN compound, and the like, and semiconductor lasers of II-VI group such as ZnCdMgSSeTe. The invention is also applicable to semiconductor lasers whose oscillation wavelength is not always in the visible range made of AlGaAs, InGaAs, InP, GaInAsNP, or the like.

The present application contains subject matter related to that disclosed in Japan Priority Patent Application JP 2009-228038 filed in the Japanese Patent Office on Sep. 30, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser comprising:
   a plurality of band-shaped ridges disposed in parallel to one another via band-shaped trenches and each including, at least, a lower cladding layer, an active layer, and an upper cladding layer in this order;
   an upper electrode formed on the top surface of each of the ridges and electrically connected to the upper cladding layer;
   a wiring layer electrically connected to the upper electrode and disposed in the air at least above the trench; and
   a pad electrode formed in at least one of two regions sandwiching the ridges and the trenches from sides and electrically connected to the upper electrode via the wiring layer,
   wherein the wiring layer in a portion above the trench has a flat shape or a concave shape which dents toward the trench, and has an uppermost layer, an Au layer, and a strain suppression layer for suppressing occurrence of a strain in the Au layer.

2. The semiconductor laser according to claim 1, wherein the wiring layer has an adhesion layer for enhancing adhesion to the top surface of the ridge and the Au layer in order from the ridge side.

3. The semiconductor laser according to claim 1, wherein the strain suppression layer is made of a metal material having higher Young's modulus and lower linear expansion coefficient than those of Au.

4. The semiconductor laser according to claim 3, wherein the strain suppression layer is formed by containing at least one of metal materials of Ti, Ni, Pt, Pd, Rh, Mo, Co, Fe, and Cr.

5. A semiconductor laser comprising:
   a plurality of band-shaped ridges disposed in parallel to one another via band-shaped trenches and each including, at least, a lower cladding layer, an active layer, and an upper cladding layer in this order;
   an upper electrode formed on the top surface of each of the ridges and electrically connected to the upper cladding layer;
   a wiring layer electrically connected to the upper electrode and disposed in the air at least above the trench; and
   a pad electrode formed in at least one of two regions sandwiching the ridges and the trenches from sides and electrically connected to the upper electrode via the wiring layer,
   wherein the wiring layer has an adhesion layer for enhancing adhesion to the top surface of the ridge, an Au layer, and a strain suppression layer for suppressing occurrence of a strain in the Au layer in order from the ridge side.

6. The semiconductor laser according to claim 5, wherein the strain suppression layer is made of a metal material having higher Young's modulus and lower linear expansion coefficient than those of Au.

7. The semiconductor laser according to claim 6, wherein the strain suppression layer formed by containing at least one of metal materials of Ti, Ni, Pt, Pd, Rh, Mo, Co, Fe and Cr.

8. The semiconductor laser according to claim 5, wherein the wiring layer in a portion above the trench has a flat shape or a concave shape which dents toward the trench.

9. The semiconductor laser according to claim 5, wherein the wiring layer in a portion above the trench has an arch shape.

* * * * *

UNITED STATES PATENT AND TRADEMARK OFFICE
CERTIFICATE OF CORRECTION

PATENT NO. : 8,223,814 B2
APPLICATION NO. : 12/888670
DATED : July 17, 2012
INVENTOR(S) : Hisayoshi Kuramochi et al.

It is certified that error appears in the above-identified patent and that said Letters Patent is hereby corrected as shown below:

On the Title Page:

Item (75) "Tatsuhiro Hirata"

should be

Item (75) --Tatsushiro Hirata--

Signed and Sealed this
Second Day of October, 2012

David J. Kappos
*Director of the United States Patent and Trademark Office*